United States Patent [19]
Shim

[11] Patent Number: 5,900,655
[45] Date of Patent: May 4, 1999

[54] CHARGE COUPLED DEVICE WITH STRIPE LAYERS CORRESPONDING TO CCD REGIONS

[75] Inventor: Jin Seop Shim, Chungcheongbuk-do, Rep. of Korea

[73] Assignee: LG Semicon Co, Ltd., Chungcheongbuk-do, Rep. of Korea

[21] Appl. No.: 08/848,555

[22] Filed: Apr. 28, 1997

[30] Foreign Application Priority Data

Aug. 26, 1996 [KR]  Rep. of Korea .................. 1996/35541

[51] Int. Cl.$^6$ ........................ H01L 27/148; H01L 29/768
[52] U.S. Cl. ......................... 257/232; 257/233; 257/432
[58] Field of Search .................................. 257/234, 252, 257/233, 432

[56] References Cited

U.S. PATENT DOCUMENTS 5,321,297  6/1994  Enomoto .
5,371,397  12/1994 Maegawa et al. .................. 257/432
5,422,285  6/1995  Ishibe .
5,479,049  12/1995 Aoki et al. ........................ 257/642
5,493,143  2/1996  Hokari ............................... 257/432
5,514,888  5/1996  Shno et al. ........................ 257/232
5,534,720  7/1996  Song et al. ........................ 257/232
5,621,461  4/1997  Higashide ......................... 348/302
5,691,548  11/1997 Akro .................................. 257/232

Primary Examiner—Ngân V. Ngô

[57] ABSTRACT

A charge coupled device and a method of manufacturing a charged coupled device includes a semiconductor substrate, a plurality of photoelectrical conversion cells formed in the semiconductor substrate in a matrix form, a plurality of vertical charge coupled device regions formed between the plurality of photoelectrical conversion cells, a plurality of stripe layers formed on the semiconductor substrate and corresponding to the plurality of vertical charge coupled device regions, and a plurality of microlenses formed on the semiconductor substrate and corresponding to the plurality of photoelectrical conversion cells.

9 Claims, 11 Drawing Sheets

CHARGE COUPLED DEVICE WITH STRIPE LAYERS CORRESPONDING TO CCD REGIONS

BACKGROUND OF THE INVENTION

1. Field of the Invention

The present invention relates to a charge coupled device ("CCD") and more particularly, to a CCD having microlenses and a method of manufacturing the CCD, in which the radius of curvature of the microlenses in the major axis direction is substantially the same as the radius curvature in the minor axis direction.

2. Description of the Related Art

Figure 1:
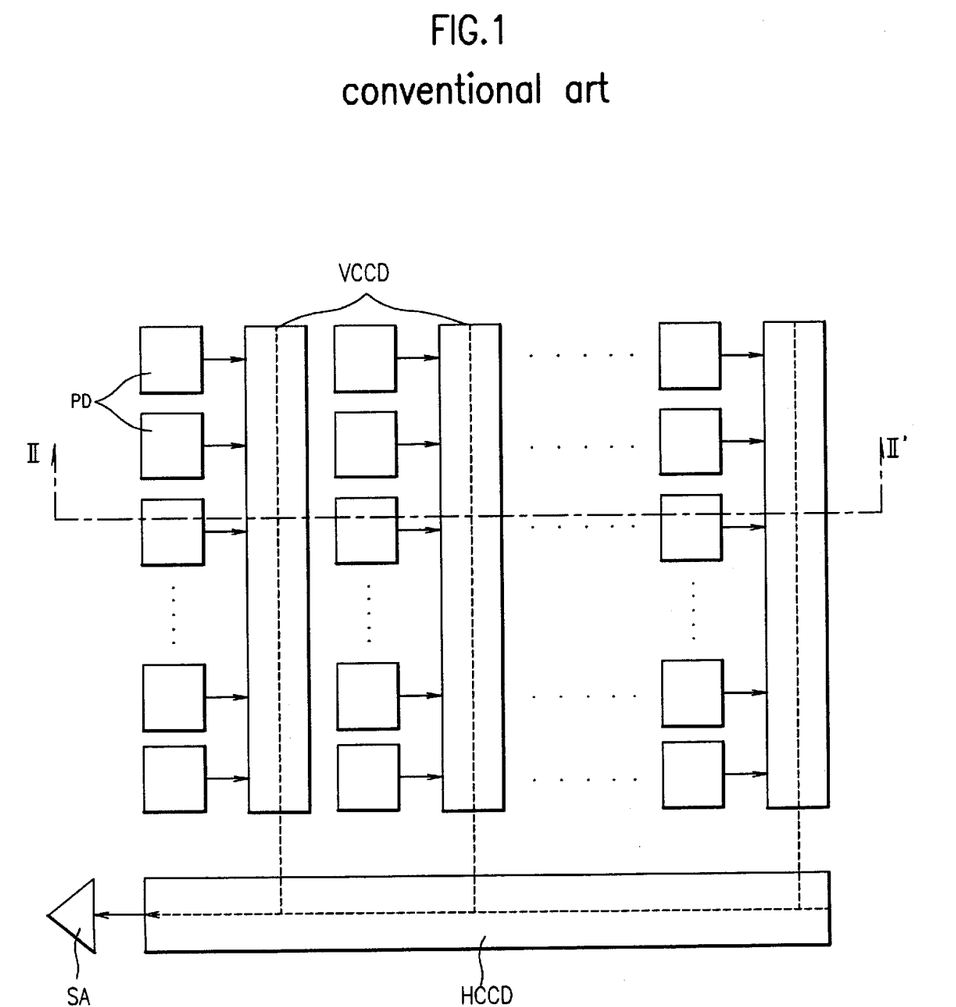
FIG. 1 is a layout diagram of a general CCD.

FIG. 1 is a layout diagram of a general CCD.

Generally, a CCD is used to convert an optical picture into an electrical signal. As shown in FIG. 1, a general CCD is composed of a plurality of photo diode (PD) regions arranged in a matrix form and spaced apart by a set distance for converting a signal of light into an electrical signal; a plurality of vertical charge coupled device (VCCD) regions formed between the photo diode regions and arranged in vertical lines for transferring the electrical signal in a vertical direction; a horizontal charge coupled device (HCCD) region for transferring the electrical signal transferred from the VCCD regions in a horizontal direction; and a sensing amplifier (SA) for sensing the electrical signal transferred from the HCCD region.

Although not shown in FIG. 1, the general CCD further includes a color filter layer and a microlens formed on each of the photo diode regions for enhancing the performance of the CCD.

Figure 2:
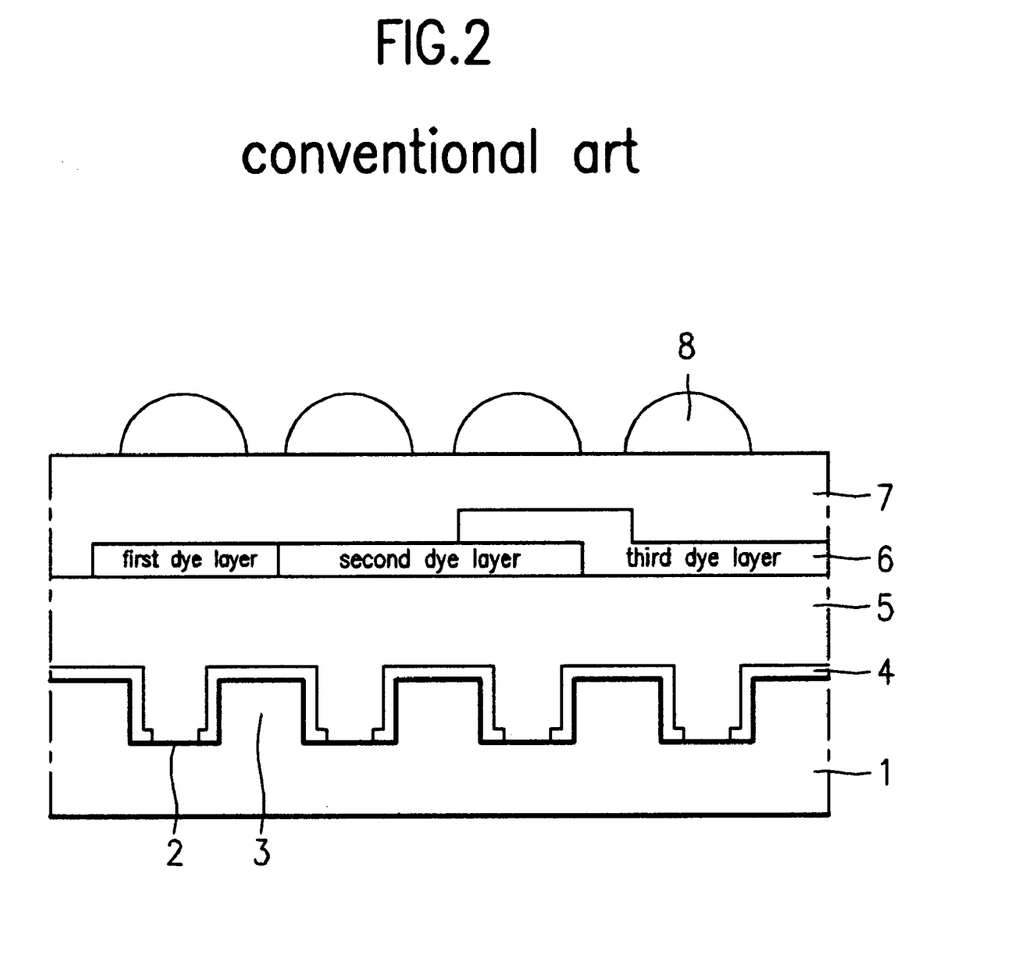
FIG. 2 is a cross-sectional view generally showing the structure of the general CCD along line II–II' of FIG. 1.

FIG. 2 is a cross-sectional view generally showing the structure of the general CCD of FIG. 1 along line II–II'.

As shown in FIG. 2, the general CCD includes photo diode regions 2 for converting a signal of light into an electrical signal. The photo diode regions 2 are arranged in a matrix form in a surface of a semiconductor substrate 1.

Between the columns of photo diode regions 2 arranged in the matrix form, vertical charge coupled device (VCCD) regions 3 are formed in the column direction for transferring the electrical signal from the photo diode regions 2 in a vertical direction. A metal shading layer 3 is formed on the VCCD regions 3, and a first planarizing layer 5 is formed on the entire surface including the metal shading layer 4 to planarize the top surface.

On the first planarizing layer 5, color filter layers 6 (first, second and third dye layers) are formed, and a second planarizing layer 7 is formed thereon. On the second planarizing layer 7, microlenses 8 are formed such that the microlenses 8 are convex toward a light source and not toward the photo diode regions 2.

In the general CCD, each of the microlenses 8 corresponds to one of the photo diode regions 2 so that all the light is directed to the photo diode regions 2.

FIGS. 3a, 3b-1 and 3b-2 are views for illustrating focusing effects of a light in the general image sensing device, such as the CCD shown in FIG. 2.

Figure 3A:
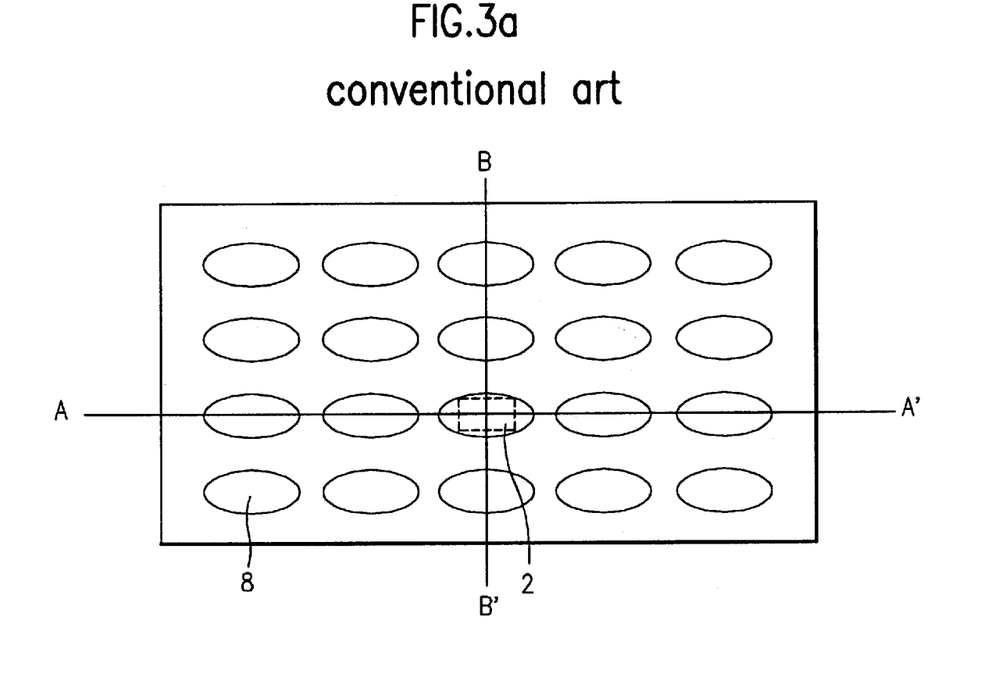
FIG. 3a is a perspective view of microlenses in the general CCD shown in FIG.1.

As shown in FIG. 3a, the microlenses 8 are arranged in a matrix form in the general CCD. Each of the microlenses 8 corresponds to one of the photo diode regions 2. Each microlens 8 has an oblong configuration due to the structure of photo diode regions 2 and VCCD regions 3.

Figure 3B:
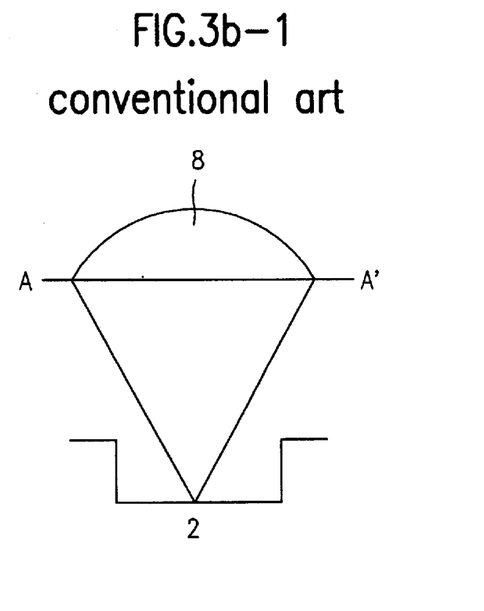
Figure 3B:
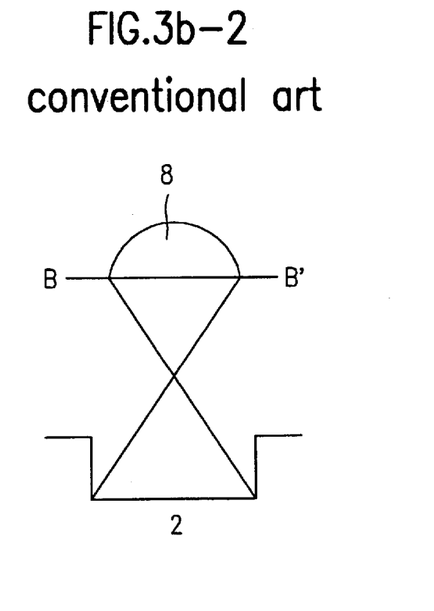

FIG. 3b-1 shows a focusing effect of a light impinging on the microlens 8 along the major axis (line A–A'), and FIG. 3b-2 shows a focusing effect of a light impinging on the microlenses 8 along the minor axis (line B–B').

As shown in FIGS. 3b-1 and 3b-2, the focusing distances of the light along the major axis and the minor axis of the microlens 8 are clearly different from each other. Accordingly, the general CCD has the following problems.

In the general CCD, microlenses are formed by patterning a photosensitive film through exposure and development process. The photosensitive is patterned in a rectangular form according to the cell configuration using a mask which is divided into a shading region and a transmitting region. A heat treatment is performed on the photosensitive film to form the microlenses. However, since the microlenses have a rectangular shape, the radius of curvature of the microlenses in the minor axis direction is substantially less than the radius of curvature of the microlenses in the major axis. As the radius of curvature of the microlens decreases, the focal distance of the microlens decreases.

The microlenses of the general LCD cannot focus the received light on the photo diode regions because of the large difference between the radii of curvature of the microlenses in the lateral direction and in the longitudinal direction. In fact, a portion of the received light is focused on other regions, e.g., an aluminum (Al) shading layer formed on the VCCD regions. As a result, in the general CCD, a relatively large loss of light and a deterioration in the resolution of the device results.

The structure of a conventional CCD and a method of manufacturing the conventional CCD for solving the aforementioned problems will be described below with reference to the attached drawings.

Figure 4:
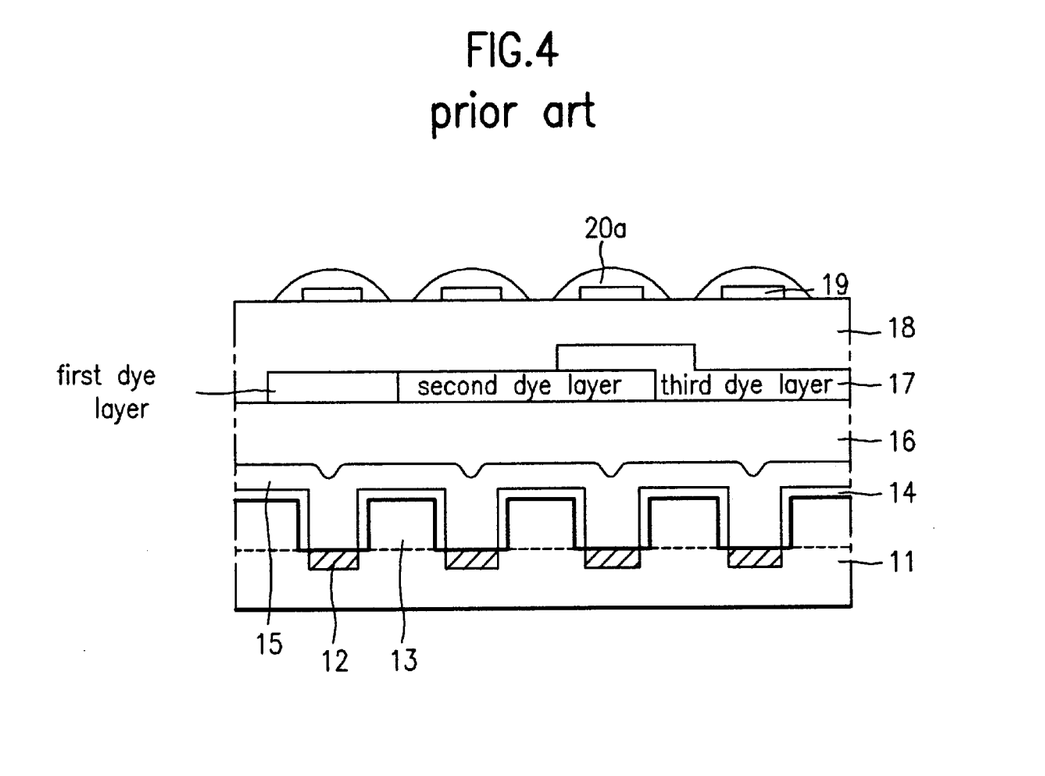
FIG. 4 is a cross-sectional view showing the structure of a conventional CCD.

FIG. 4 is a cross-sectional view showing the structure of a conventional CCD.

In the conventional CCD as shown in FIG. 4, photo diode regions 12 for converting a light signal into an electrical signal are arranged in a matrix form. The photo diode regions 12 are spaced apart by a predetermined distance in the surface of a semiconductor substrate 11.

Between the photo diode regions 12, vertical charge coupled device (VCCD) regions 13 are formed for transferring the electrical signal in a vertical direction. On the VCCD regions 3, a metal shading layer 14 is formed for shielding the light from regions except the light-receiving regions of the device. An insulating film 15 for passivation and a first planarizing layer 16 are sequentially formed on the entire surface including the metal shading layer 14. Color filter layers 17 (first, second and third dye layers) are formed on the first planarizing layer 16 to transmit only the specific wavelengths of the light. A second planarizing layer 18 is formed on the entire surface including the color filter layers 17, and block stripe patterns 19 corresponding to the photo diode regions 12 are formed. On the block stripe patterns 19, microlenses 20a are formed. Each of the microlenses 20a corresponds to one of the photo diode regions 12.

A method of manufacturing the conventional CCD of FIG. 4 will be described below.

Figure 5A:
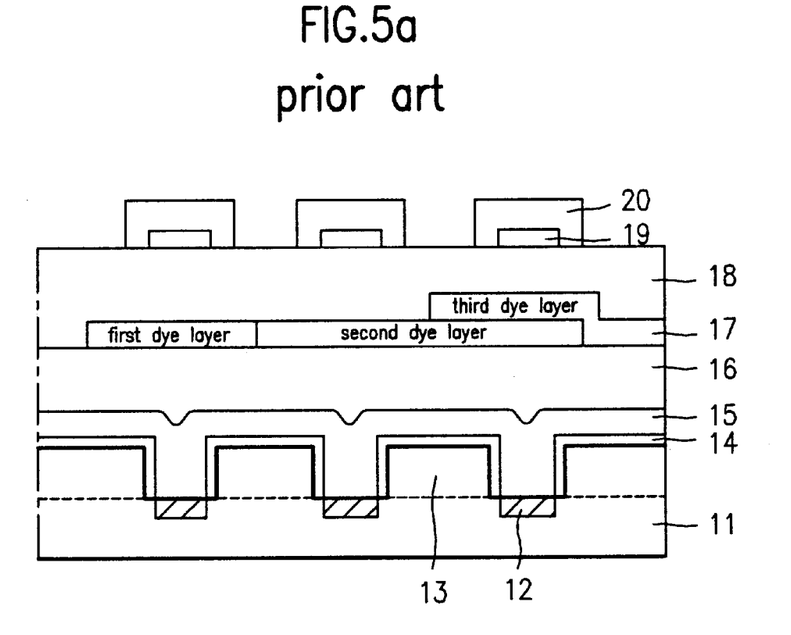
FIGS. 5a and 5b are cross-sectional views for illustrating a method of manufacturing the conventional CCD of FIG. 4.
Figure 5B:
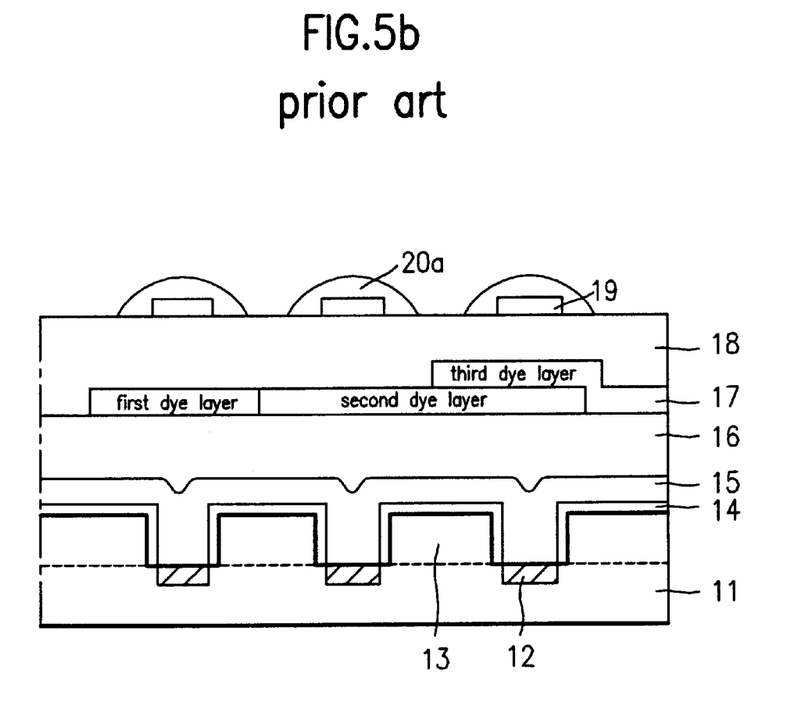

FIGS. 5a and 5b are cross-sectional views for illustrating a method of manufacturing the conventional CCD of FIG. 4.

To begin with, as shown in FIG. 5a, the photo diode regions 12 are formed in a matrix form and are spaced apart by a predetermined distance in the upper surface of the semiconductor substrate 11.

Between the columns of photo diode regions 12, VCCD regions 13 are formed in the column direction to transfer an electrical signal in a vertical direction. The metal shading layer 14 is selectively formed on the VCCD regions 13 but not on the photo diode regions. The insulating film 15 as a passivation layer is formed on the entire surface including the metal shading layer 14, and the first planarizing layer 16 is formed thereon.

A photoresist (not shown) with dyeability is coated on the first planarizing layer 16 and patterned through exposure and development process. Using a dyeing apparatus, dyeing is performed on the patterned photoresist to form a first dye layer of the color filter layers 17.

Using the same dyeing method, a second dye layer of the color filter layers 17 is formed on a predetermined portion of the first planarizing layer 16. Successively, a third dye layer of the color filter layers 17 is formed on a predetermined portion of the first planarizing layer 16 so as to overlap the second dye layer. The color filter layers 17 are then successfully formed on the first planarizing layer 16.

On the entire surface including the color filter layers 17, the second planarizing layer 18 is formed and coated with a sensitive resin having good transmissivity. The sensitive resin coated on the second planarizing layer 18 is patterned through exposure and development process to form the block stripe patterns 19. The block stripe patterns correspond to the photo diode regions 12.

On the entire surface including the block stripe patterns 19, a photosensitive film is coated and patterned through exposure and development process to form photosensitive film patterns 20 only on the block stripe patterns 19.

A reflow process is performed on the photosensitive film patterns 20 to form microlenses 20a. The microlenses 20a are formed on the block stripe patterns 19 as shown in FIG. 5b. Both the microlenses 20a and block stripe patterns 19 correspond to the photo diode regions.

Figure 10A:
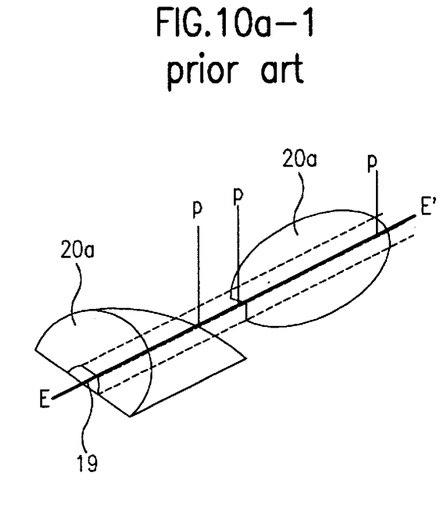

The conventional CCD of FIG. 4 and the conventional method for forming the same as shown in FIGS. 5a and 5b, however, have the following problem which is illustrated in FIGS. 10a-1 and 10a-b.

Figure 10A:
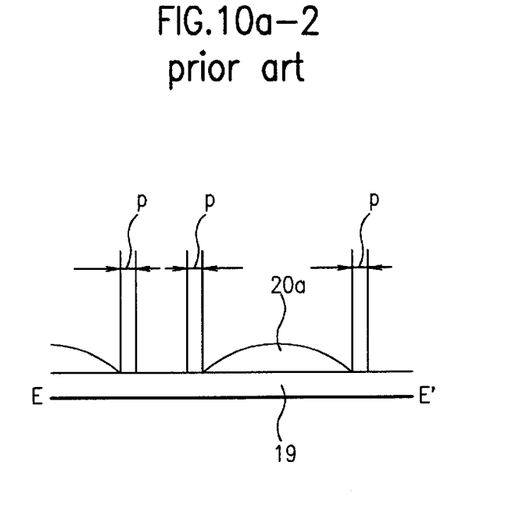

As shown in FIG. 10a-1, the block stripe pattern 19 extends in one direction (along line E–E'). The microlens 20a covers the block strip pattern 19a so that the block strip pattern 19 extends through the middle of the microlens 20a. FIG. 10a-2 shows a portion of a cross-sectional view along line E–E' in FIG. 10a-1.

As shown in FIG. 10a-2, some of the light impinging on the microlens 20a is lost because the block strip pattern 19 is formed underneath in the middle of the microlens 20a. "P" represents the amount of light lost thereby. Therefore, although the radius of curvature difference between the major axis and minor axis may have been reduced, the light is lost and the performance of the conventional CCD is unsatisfactory.

SUMMARY OF THE INVENTION

Accordingly, the present invention is directed to a CCD and a method of manufacturing a CCD which substantially obviates one or more of the problems due to limitations and disadvantages of the related art.

An object of the present invention is to provide a CCD and a method of manufacturing the CCD which improves sensitivity thereof by enhancing the focusing efficiency of microlenses.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a CCD including a semiconductor substrate, a plurality of photoelectrical conversion cells formed in a surface of the semiconductor substrate in a matrix, a plurality of vertical charge coupled device regions formed in the surface of the semiconductor substrate between the plurality of photoelectrical conversion cells, a first planarizing layer formed over the semiconductor substrate, a plurality of stripe-shaped layers formed over the first planarizing layer and corresponding to positions of the plurality of vertical charge coupled device regions, and a plurality of microlenses formed on the first planarizing layer and corresponding to positions of the plurality of photoelectrical conversion cells.

Further, there is provided a method of manufacturing a CCD according to the embodiments of the present invention, including the steps of forming a plurality of photoelectrical conversion cells in a surface of a semiconductor substrate, forming a plurality of vertical charge coupled device regions in the surface of the semiconductor substrate between the plurality of photoelectrical conversion cells in one direction, forming a first planarizing layer over the semiconductor substrate, forming a plurality of stripe-shaped layers over the first planarizing layer corresponding to positions of the plurality of vertical charge coupled device regions, and forming a plurality of microlenses on the first planarizing layer corresponding to positions of the plurality of photoelectrical conversion cells.

It is to be understood that both the foregoing general description and the following detailed description are exemplary and explanatory and are intended to provide further explanation of the invention as claimed.

Briefly described, the present invention is directed to a CCD including a semiconductor substrate, a plurality of photoelectrical conversion cells formed in the semiconductor substrate in a matrix form, a plurality of charge coupled device regions formed between the plurality of photoelectrical conversion cells, a plurality of stripe layers formed on the semiconductor substrate and corresponding to the plurality of charge coupled device regions, and a plurality of microlenses formed on the semiconductor substrate and corresponding to the plurality of photoelectrical conversion cells.

Further, the present invention is directed to a method of manufacturing a CCD including the steps of forming a plurality of photoelectrical conversion cells in a surface of a semiconductor substrate; forming a plurality of vertical charge coupled device regions between the plurality of photoelectrical conversion cells; forming a plurality of stripe layers on the semiconductor substrate so that the plurality of stripe layers correspond to the plurality of charge coupled device regions; and forming a plurality of microlenses on the semiconductor substrate so that the plurality of microlenses correspond to the plurality of photoelectrical conversion cells.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings, wherein:

FIGS. 3b-1 and 3b-2 are views for illustrating varying focusing distances of the microlenses of the general CCD, taken alone line A–A' and B–B', respectively;

FIGS. 8b-1 and 8b-2 are views for illustrating focusing distances of the microlenses, taken alone lines C–C' and D–D' of FIG. 8a, respectively;

FIG. 10a-1 is a perspective view for illustrating a focusing effect of a microlens in the conventional CCD shown in FIG. 4;

FIG. 10a-2 is a cross-sectional view generally taken alone line E–E' of FIG. 10a-1;

FIG. 10b-1 is a perspective view for illustrating a focusing effect of a microlens in accordance with the embodiments of the present invention; and FIG. 10b-2 is a cross-sectional view generally taken alone line F–F' of FIG. 10b-1.

DETAILED DESCRIPTION OF PREFERRED EMBODIMENTS

Reference will now be made in detail to the preferred embodiments of the present invention, examples of which are illustrated in the accompanying drawings.

Figure 6:
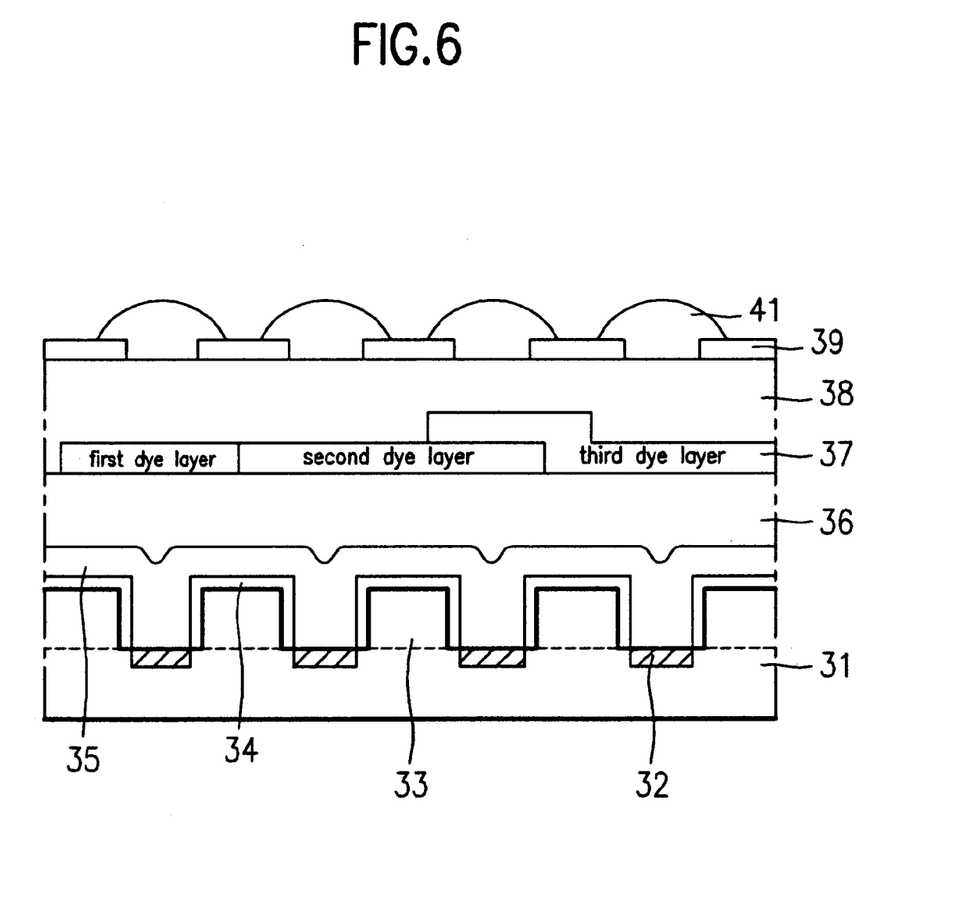
FIG. 6 is a cross-sectional view showing an example of the structure of a CCD in accordance with the embodiments of the present invention.

FIG. 6 is a cross-sectional view showing the structure of a CCD in accordance with the embodiments of the present invention.

In the CCD of the present invention, photo diode regions 32 for converting a light signal into an electrical signal are formed in the surface of a semiconductor substrate 31. The photo diode regions 32 are arranged in a matrix form, and the rows and columns of photo diode regions 32 are spaced apart by a predetermined distance.

Between the columns of photo diode regions 32, vertical charge coupled device (VCCD) regions 33 are formed in the column direction to transfer the electrical signal generated from adjacent photo diode regions 32 in a vertical direction. A metal shading layer 34 is formed on the VCCD regions 33 to block the light from regions except the light-receiving regions thereof. An insulating film 35 as a passivation layer is formed on the metal shading layers 34. The structure formed thus far constitutes a black and white CCD.

On the insulating film 35, a first planarizing layer 36 is formed. Color filter layers 37 (first, second and third dye layers) are formed on the first planarizing layer 36 for transmitting specific wavelengths of the light to the corresponding photo diode regions 32.

A second planarizing layer 38 is formed on the entire surface including the color filter layers 37. The thickness of the second planarizing layer 38 is 0.5~1.8 μm. A plurality of block stripe patterns 39 are formed on the second planarizing layer 38 in the direction of the major axis of pixels. The block stripe patterns 39 correspond to the VCCD regions 33. The block stripe patterns 39 are spaced apart by a predetermined distance. The block stripe patterns 39 can have various polygonal configurations, such as a triangular pillar configuration, a square pillar configuration, a semicircular pillar configuration and the like.

On the second planarizing layer 38, a plurality of microlenses 41 are formed. The microlenses 41 are formed between the block strip patterns 39 so that each of the microlenses 41 corresponds to one of the photo diode regions 32.

Therefore, the CCD in accordance with the present invention includes the block strip patterns 39 which correspond to the VCCD regions 33 and the microlenses 41 which correspond to the photo diode regions 32.

Figure 8A:
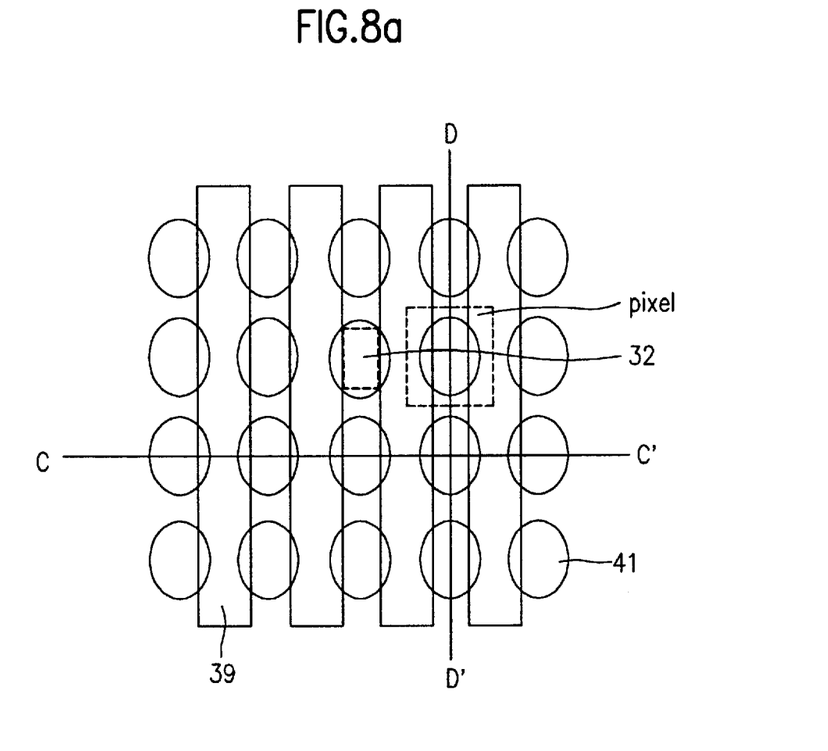
FIG. 8a is a perspective view showing microlenses in the CCD in accordance with the present invention.
Figure 8B:
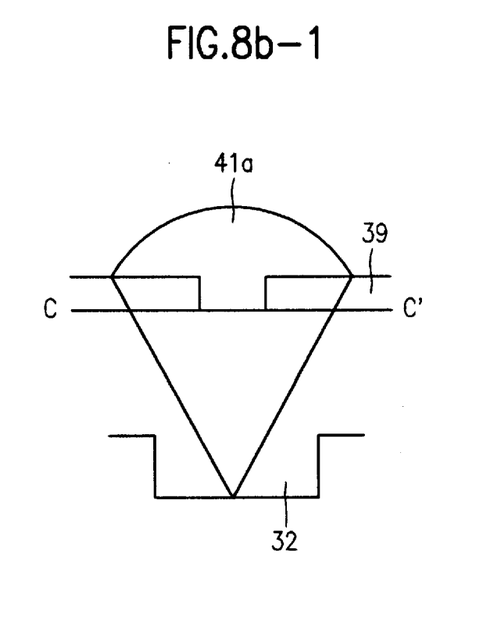
Figure 8B:
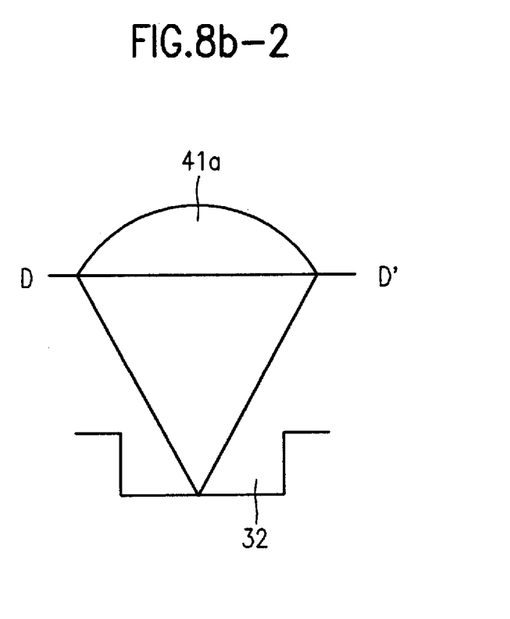

FIGS. 8a, 8b-1 and 8b-2 are views for illustrating the focusing distance of the microlenses in the present CCD. FIG. 8b-1 shows a portion of a cross-sectional view taken along line C–C' in FIG. 8a, and FIG. 8b-2 shows a portion of a cross-sectional view taken along line D–D' in FIG. 8a in accordance with the present invention.

As shown in FIG. 8a, the microlenses 41 are arranged in a matrix form. The block stripe patterns 39 extend in the major axis of the pixels between the microlenses 41. Edge portions of the microlenses 41 directly cover the block stripe patterns 39.

As shown in FIGS. 8b-1 and 8b-2, the focusing distance of the microlens 41 in the major axis direction is the same as the focusing distance of the microlens 41 in the minor axis direction. Therefore, the present invention allows the maximum focusing effect of the microlenses and enhances the performance of the CCD with a simple structure.

Moreover, the light lost in the conventional CCD, which is represent by "P" in FIGS. 10a-1 and 10-2, is now focused on the photo diode regions 32.

Figures 10B, 10B:
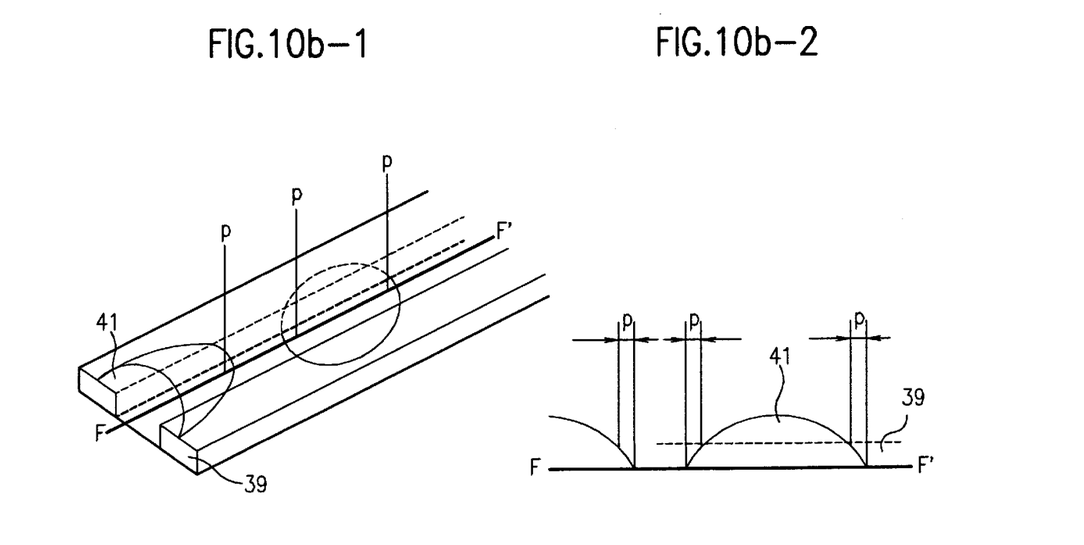

As shown in FIG. 10b-1, the microlenses 41 are formed between two block stripe patterns 39. The block stripe patterns 39 extend in the direction of the major axis of the pixels (along line F–F')

FIG. 10b-2 shows a portion of a cross-sectional view taken along line F–F' in FIG. 10b-1. As shown in FIG. 10b-2, the light "P" which would have been lost according to the conventional CCDs is focused on the photo diode regions 32 because the microlenses 41 are formed between the block stripe patterns 39 and not directly underneath one block stripe pattern as in the conventional CCDs. Therefore the performance of the CCD is greatly improved.

A method of manufacturing the CCD, e.g., shown in FIG. 6, will be described below according to a first embodiment of the present invention.

Figure 7A:
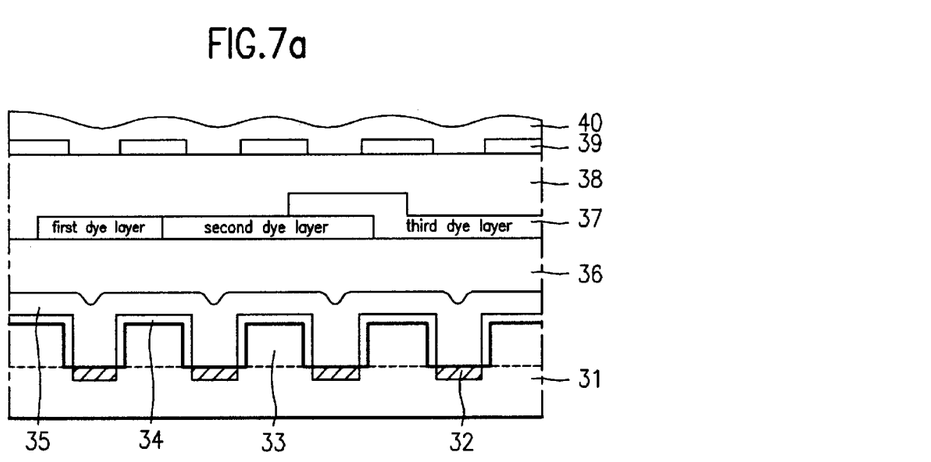
FIGS. 7a to 7c are cross-sectional views for illustrating a method of manufacturing a CCD according to a first embodiment of the present invention.
Figure 7B:
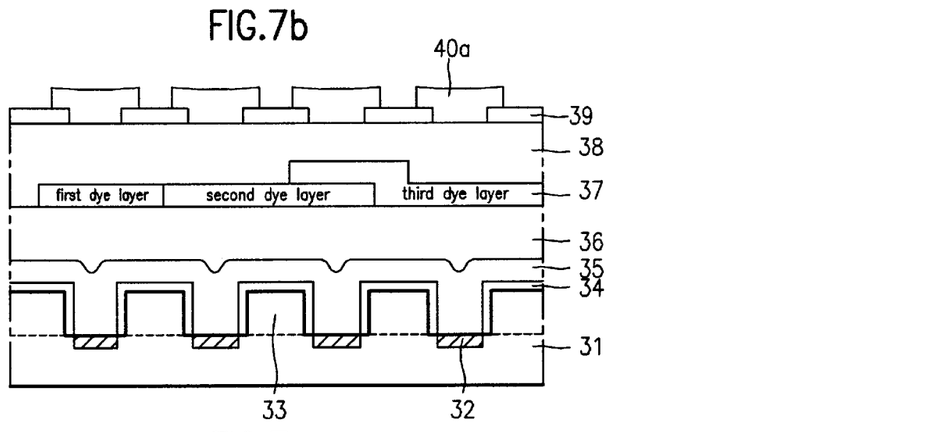
Figure 7C:
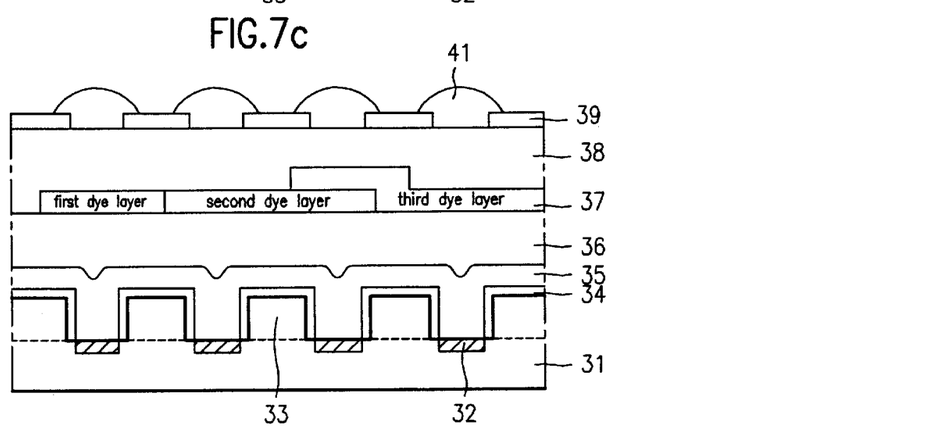

FIGS. 7a to 7c are cross-sectional views for illustrating a method of manufacturing a CCD according to the first embodiment of the present invention.

To begin with, as shown in FIG. 7a, the photo diode regions 32 for converting a light signal into an electrical signal are formed in a surface of the semiconductor substrate 31. The photo diode regions 32 are spaced apart by a predetermined distance and arranged in a matrix form.

Between the columns of photo diode regions 32, a column of vertical charge coupled device (VCCD) regions 33 are formed to transfer the electrical signal in a vertical direction to a horizontal charged coupled device (HCCD) region. A metal is deposited on the entire surface and selectively removed from the photo diode regions 32 to form the metal shading layer 34. The metal shading layer 34 prevents any light from impinging directly on the VCCD regions 33. The insulating film 35 for passivation is formed on the entire surface including the metal shading layer 34 to form a black and white CCD.

On the passivation insulating film 35, the first planarizing layer 36 is formed to reduce steps and improve step coverage. A photoresist is coated on the first planarizing layer 36 and patterned through exposure and development process. The patterned photoresist is dyed using a dyeing apparatus to form a first dye layer of the color filter layers 37.

Using the same dyeing method, a second dye layer is formed on a predetermined portion of the first planarizing layer 36. Successively, a third dye layer is formed on a predetermined portion of the first planarizing layer 36 to overlap the second dye layer. The first, second and third dye layers constitute the color filter layers 37 which transmit specific wavelengths of the light to the corresponding photo diode regions 32.

The second planarizing layer 38 is formed on the entire surface including the color filter layers 37. A sensitive resin with a high transmissivity is coated on the second planarizing layer 38 and patterned through exposure and development process to form the block stripe patterns 39 with a thickness of 0.4~1.5 μm. The block stripe patterns 39 extend in the direction of the major axis of pixels. The block stripe patterns 39 are positioned to correspond to the VCCD regions 33.

The sensitive resin for forming the block stripe patterns 39 can be patterned into any one of the groups of various polygonal configurations, such as a triangular pillar configuration, a square pillar configuration, a semicircular pillar configuration and the like.

To form microlenses, a photosensitive film 40 is formed over the block stripe patterns 39. The photosensitive film 40 is formed to be in accord with the uneven state of the block stripe patterns 39. The difference between the refractive index of the sensitive resin for forming the block stripe patterns 39 and the refractive index of the photosensitive film 40 may be ±0.05. The transmissivity of the sensitive resin may be 85% or more.

As shown in FIG. 7b, the photosensitive film 40 is patterned through exposure and development processes to form photosensitive film patterns 40a. Each of the photosensitive film patterns 40a corresponds to one of the photo diode regions 32. Each photosensitive film pattern 40a has a block configuration and extends over the surfaces of adjacent block stripe patterns 39.

The photosensitive film patterns 40a are heat-reflowed to form the plurality of microlenses 41. Each of the microlenses 41 is formed between the block stripe patterns 39 and corresponds to one of the photosensitive regions 32.

FIGS. 9a to 9d are cross-sectional views for illustrating a method of manufacturing a CCD according to a second embodiment of the present invention.

Figure 9A:
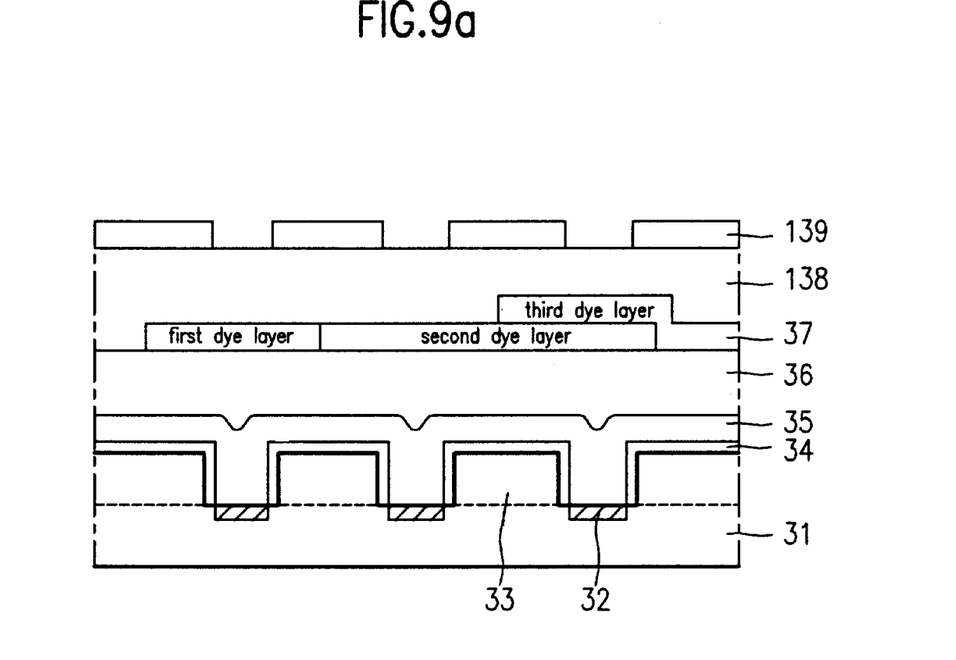
FIGS. 9a to 9d are cross-sectional views for illustrating a method of manufacturing a CCD according to a second embodiment of the present invention.

To begin with, as shown in FIG. 9a, the photo diode regions 32 and the vertical CCD regions 33 are formed in a surface of the semiconductor substrate 31. The metal shading layer 34, insulating film 35 for passivation, first planarizing layer 36 and color filter layers 37 are formed on the semiconductor substrate 31. Then a second planarizing layer 138 is formed on the entire surface including the color filter layers 37.

A sensitive resin is coated on the second planarizing layer 138 and patterned through exposure and development processes to form block stripe patterns 139 having a block stripe configuration.

Figure 9B:
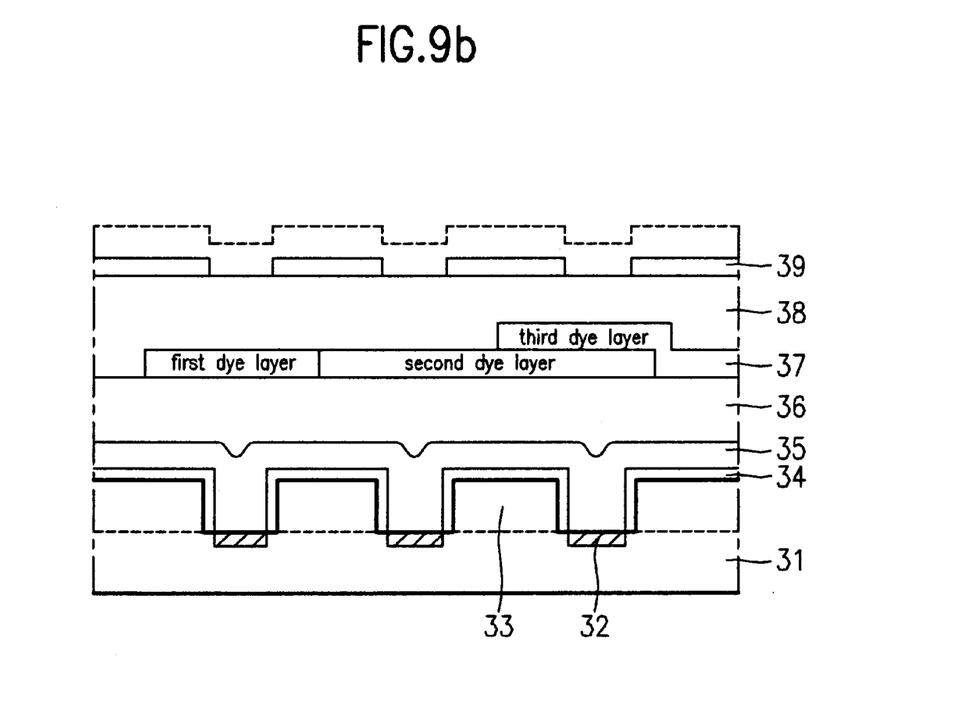

As shown in FIG. 9b, the entire surface of the second planarizing layer 138 including the block striate patterns 139 is overall-etched to a predetermined depth to form the final block stripe patterns 39 and the final second planarizing layer 38.

The final overall-etched block stripe patterns 39 may have a thickness of 0.4~1.5 μm. The block stripe patterns 39 can be patterned to have various polygonal configurations, such as a triangular pillar configuration, a square pillar configuration, a semicircular pillar configuration and the like. The block stripe patterns 39 correspond to the VCCD regions 33.

Figure 9C:
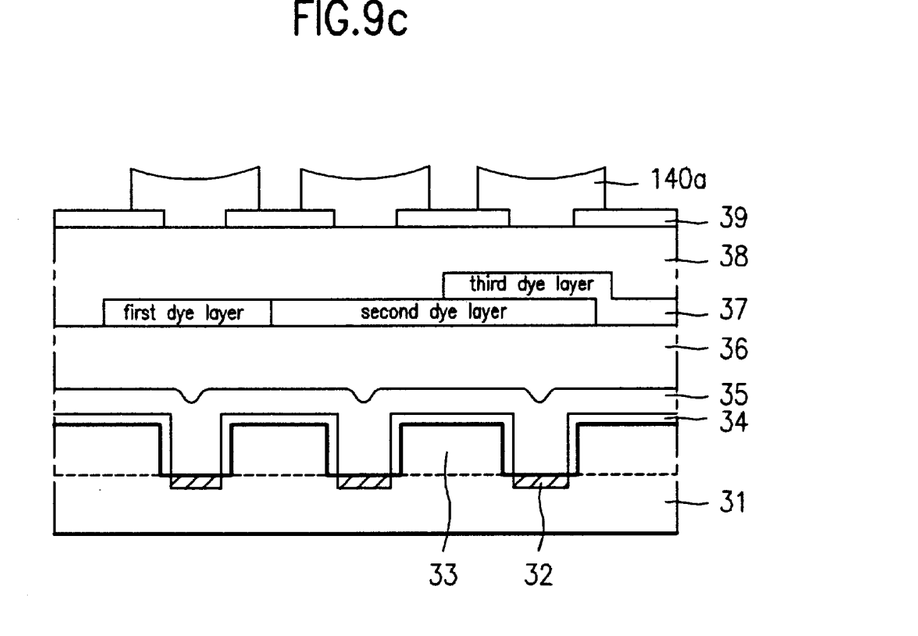

As shown in FIG. 9c, a photosensitive film is deposited over the block stripe patterns 39 and the second planarizing layer 38 so that it is in accord with the uneven state of the block stripe patterns 39 located underneath. Through exposure and development process, the photosensitive film is selectively removed to form photosensitive film patterns 140a between the block stripe patterns 39.

Figure 9D:
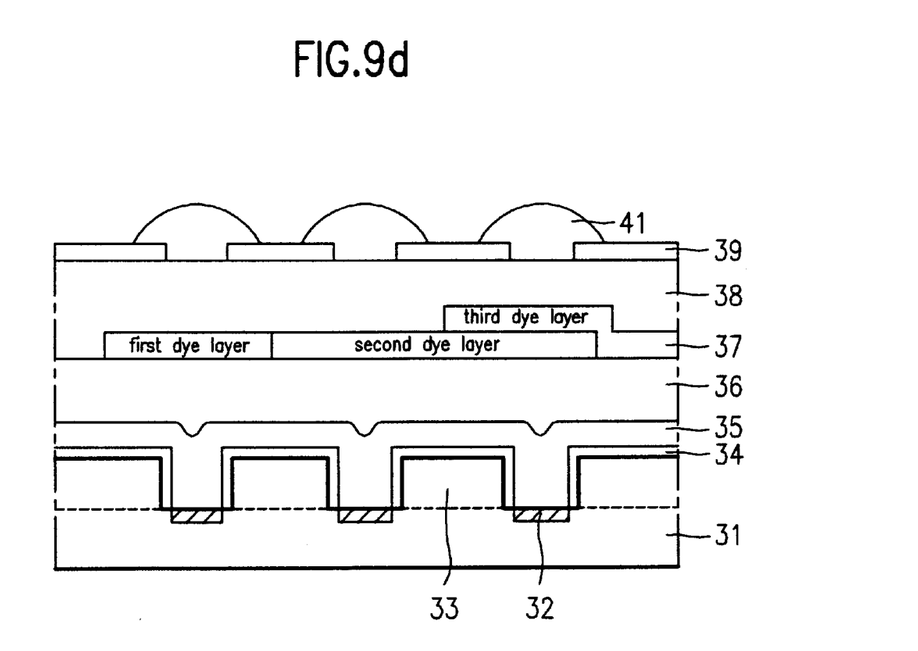

As shown in FIG. 9d, the photosensitive film patterns 140a are heat-reflowed to form the microlenses 41. Each of the microlenses 41 corresponds to one of the photo diode regions 32, whereas the block stripe patterns 39 correspond to the VCCD regions 33 formed between the photo diode regions 32.

The relation between the refractive index (P) of the second planarizing layer 38 and the refractive index (M) of the microlens 41 is:

$$M \leq P \leq M+3.$$

In the CCD according to the present invention, the incident light passes through the microlenses 41, second planarizing layer 38, and color filter layers 37 prior to reaching the photo diode regions 32. The microlenses 41 are formed so that all the light is focused on the photo diode regions 32 for a maximum effect.

The focused light is received by the photo diode regions 32 and converted into an electrical signal. The electrical signal is transferred through the VCCD regions and HCCD region to a floating diffusion layer. At which point, a portion of the electrical signal is directed to a reset drain and a portion of the electrical signal is directed to a sensing amplifier for outputting or further processing.

According to the embodiments of the present invention, the radius of curvature of a microlens in the major axis direction and the radius of curvature of the microlens in the minor axis direction is the same or substantially similar. Therefore, the loss of imaging light is prevented and the sensitivity and resolution of the CCD is greatly improved.

It will be apparent to those skilled in the art that various modifications and variations can be made in the structure of a CCD and a method of manufacturing the same of the present invention without departing from the spirit or scope of the invention. Thus, it is intended that the present invention cover the modifications and variations of this invention provided they come within the scope of the appended claims and their equivalents.

What is claimed is:

1. A charge coupled device comprising:
a semiconductor substrate;
a plurality of photodiode regions formed in the semiconductor substrate in a matrix pattern;
a plurality of charge coupled device regions formed between the plurality of photodiode regions;
a plurality of stripe layers formed on the semiconductor substrate and corresponding to the plurality of charge coupled device regions; and
a plurality of microlenses formed directly on the plurality of stripe layers and corresponding to the plurality of photodiode regions.

2. The charge coupled device as claimed in claim 1, wherein the plurality of stripe layers have high light transmissivity.

3. The charge coupled device as claimed in claim 1, wherein each of the microlenses directly covers an edge portion of one of the stripe layers and an edge portion of another of the stripe layers.

4. The charge coupled device as claimed in claim 3, wherein a vertical cross-section of each of the plurality of stripe layers has a substantially rectangular configuration.

5. The charge coupled device as claimed in claim 1, wherein the plurality of stripe layers are formed with a photosensitive material having light transmissivity greater than or equal to approximately 85% in a visible ray region.

6. The charge coupled device as claimed in claim 1, wherein the difference between a reflective index of plurality of stripe layers and a reflective index of the plurality of microlenses is approximately ±0.05.

7. The charge coupled device as claimed in claim 6, further comprising:
a planarizing layer formed over the plurality of charge coupled device regions and over the plurality of photodiode regions.

8. The charge coupled device as claimed in claim 7, wherein a relationship between a reflective index (P) of the planarizing layer and a reflective index (M) of the plurality of microlenses is:

$$M \leq P \leq M+3.$$

9. The charge coupled device as claimed in claim 1, wherein a focusing distance of each of the microlenses in its major axis is substantially the same as a focusing distance of said each of the microlenses in its minor axis.

* * * * *